(12) United States Patent
Park

(10) Patent No.: US 10,586,603 B2
(45) Date of Patent: Mar. 10, 2020

(54) MEMORY DEVICE AND OPERATING METHOD THEREOF

(71) Applicant: SK hynix Inc., Icheon-si, Gyeonggi-do (KR)

(72) Inventor: Hyun Kyu Park, Cheonan-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/628,808

(22) Filed: Jun. 21, 2017

(65) Prior Publication Data

US 2018/0090217 A1 Mar. 29, 2018

(30) Foreign Application Priority Data

Sep. 29, 2016 (KR) .................. 10-2016-0125640

(51) Int. Cl.
| | |
|---|---|
| *G11C 16/34* | (2006.01) |
| *G11C 16/10* | (2006.01) |
| *G11C 16/04* | (2006.01) |
| *G11C 11/56* | (2006.01) |
| *H01L 27/11573* | (2017.01) |
| *H01L 27/11582* | (2017.01) |

(52) U.S. Cl.
CPC ...... *G11C 16/3427* (2013.01); *G11C 11/5628* (2013.01); *G11C 16/0483* (2013.01); *G11C 16/10* (2013.01); *G11C 16/3459* (2013.01); *H01L 27/11573* (2013.01); *H01L 27/11582* (2013.01)

(58) Field of Classification Search
CPC .......... G11C 16/3427; G11C 11/5628
USPC .................................. 365/185.22
See application file for complete search history.

(56) References Cited

U.S. PATENT DOCUMENTS

| | | | | |
|---|---|---|---|---|
| 9,230,663 | B1 * | 1/2016 | Lu ............ | G11C 11/5628 |
| 2011/0110161 | A1 * | 5/2011 | Lee ........... | G11C 16/3418 |
| | | | | 365/185.18 |
| 2012/0044771 | A1 * | 2/2012 | Joo ............ | G11C 16/0483 |
| | | | | 365/185.22 |
| 2012/0081957 | A1 * | 4/2012 | Kim ........... | G11C 11/5628 |
| | | | | 365/185.2 |
| 2012/0243323 | A1 * | 9/2012 | Dong .......... | G11C 11/5628 |
| | | | | 365/185.19 |

(Continued)

FOREIGN PATENT DOCUMENTS

| | | |
|---|---|---|
| KR | 1020100010722 A | 2/2010 |
| KR | 1020100056860 A | 5/2010 |
| KR | 1020090014531 A | 2/2017 |

*Primary Examiner* — Huan Hoang
*Assistant Examiner* — Muna A Techane
(74) *Attorney, Agent, or Firm* — William Park & Associates Ltd.

(57) ABSTRACT

There are provided a memory device and an operating method thereof. A memory device may include a memory block, peripheral circuits, and a control logic. The memory block may include a plurality of memory cells. The peripheral circuits may perform a program operation on the memory cells. The control logic may control the peripheral circuits to apply, during the program operation, a program voltage to a selected word line and selectively apply, to one or more unselected word lines, a second pass voltage lower than a first pass voltage set as a default voltage during a blind program period which does not include a verify operation.

19 Claims, 12 Drawing Sheets

(56) References Cited

U.S. PATENT DOCUMENTS

| | | | |
|---|---|---|---|
| 2013/0100747 A1* | 4/2013 | Leem | G11C 7/00 |
| | | | 365/189.011 |
| 2015/0262678 A1* | 9/2015 | Kim | G11C 16/10 |
| | | | 365/185.22 |
| 2016/0148693 A1* | 5/2016 | Lee | G11C 16/10 |
| | | | 365/185.11 |
| 2016/0372185 A1* | 12/2016 | Shim | G11C 11/5635 |
| 2018/0040368 A1* | 2/2018 | Shim | G11C 11/5635 |

* cited by examiner

MEMORY DEVICE AND OPERATING METHOD THEREOF

CROSS-REFERENCE TO RELATED APPLICATION

The present application claims priority under 35 U.S.C § 119(a) to Korean patent application number 10-2016-0125640 filed on Sep. 29, 2016 in the Korean Intellectual Property Office, the entire disclosure of which is incorporated by reference herein.

BACKGROUND

1. Technical Field

An aspect of the present disclosure generally relates to a memory device and an operating method thereof, and, more particularly, to a method of performing a program operation of a memory device.

2. Related Art

Memory devices may be classified into volatile memory devices and nonvolatile memory devices.

Among these memory devices, the non-volatile memory devices operate (e.g., read/write) at relatively slow speeds as compared with the volatile memory devices, but can retain stored data even when a power supply is cut off. Therefore, the non-volatile memory devices are frequently used in portable electronic devices to store data that needs to be retained regardless of whether power is supplied.

The non-volatile memory devices may include a read only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetoresistive RAM (MRAM), a resistive RAM (RRAM), a ferroelectric RAM (FRAM), and the like according to a method of storing data therein.

The flash memory may be formed in a two-dimensional structure in which cell strings are arranged horizontally to a semiconductor substrate, or may be formed in a three-dimensional structure in which cell strings are arranged vertically to a semiconductor substrate. A three-dimensional semiconductor device is a memory device that has been proposed as a way to overcome the integration limit of two-dimensional semiconductor devices, and may include a plurality of cell strings vertically stacked on the semiconductor substrate.

SUMMARY

Embodiments provide a memory device and an operating method thereof, which can improve the reliability of a program operation.

According to an aspect of the present disclosure, there is provided a memory device including a memory block, peripheral circuits, and a control logic. The memory block may include a plurality of memory cells. The peripheral circuits may perform a program operation on the memory cells. The control logic may control the peripheral circuits to apply, during the program operation, a program voltage to a selected word line and selectively apply, to one or more unselected word lines, a second pass voltage lower than a first pass voltage set as a default voltage during a blind program period which does not include a verify operation.

According to an aspect of the present disclosure, there is provided a method of operating a memory device. The method may include, during a blind program period during which a program voltage is applied to a selected word line without performing a verify operation, applying a second pass voltage lower than a first pass voltage set as a default voltage to one or more unselected word lines.

According to an aspect of the present disclosure, there is provided a method of operating a memory device. The method may include determining whether a program operation set to be performed includes a blind program period in which a program voltage is applied to a selected word line without performing a verify operation, in response to a program command. The method may include, when the program operation includes a blind program period, programming selected memory cells by applying the program voltage to the selected word line and applying a second pass voltage lower than a first pass voltage set as a default voltage to unselected word lines.

DETAILED DESCRIPTION

Figure 1:
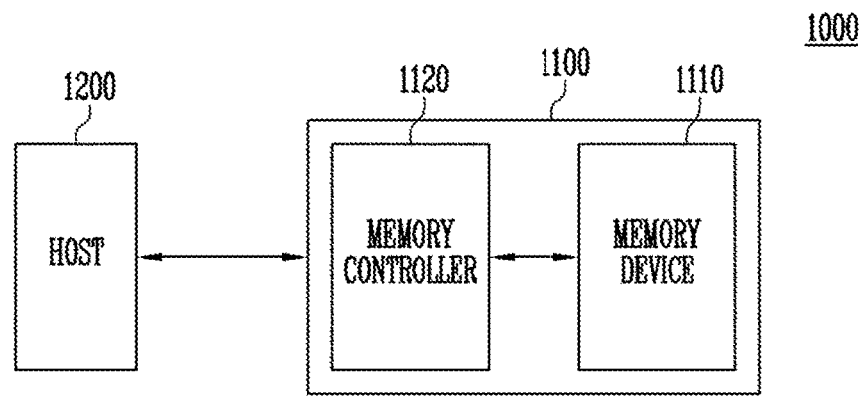
FIG. 1 is a diagram illustrating an example of a memory system according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 is a diagram illustrating an example of a memory system according to an embodiment of the present disclosure.

Referring to FIG. 1, the memory system 1000 may include a storage device 1100 and a host 1200 for controlling the storage device 1100. The storage device 1100 may include a memory device 1110 in which data is stored and a memory controller 1120 for controlling the memory device 1110.

The host 1200 may communicate with the storage device 1100 by using an interface protocol such as peripheral component interconnect-express (PCI-E), advanced technology attachment (ATA), serial ATA (SATA), parallel ATA (PATA), or serial attached SCSI (SAS). In addition, interface protocols between the host 1200 and the storage device 1100 are not limited to the above-described examples, and may be one of other interface protocols such as a universal serial bus (USB), a multi-media card (MMC), an enhanced small disk interface (ESDI), and integrated drive electronics (IDE).

The memory controller 1120 controls the general operations of the storage device 1100, and controls data exchange between the host 1200 and the memory device 1110. For example, the memory controller 1120 may control the memory device 1110 to perform a program, read, or erase operation in response to a request of the host 1200.

The memory device 1110 may include a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), and a flash memory. In an embodiment, the memory device 1110 may include a flash memory.

Figure 2:
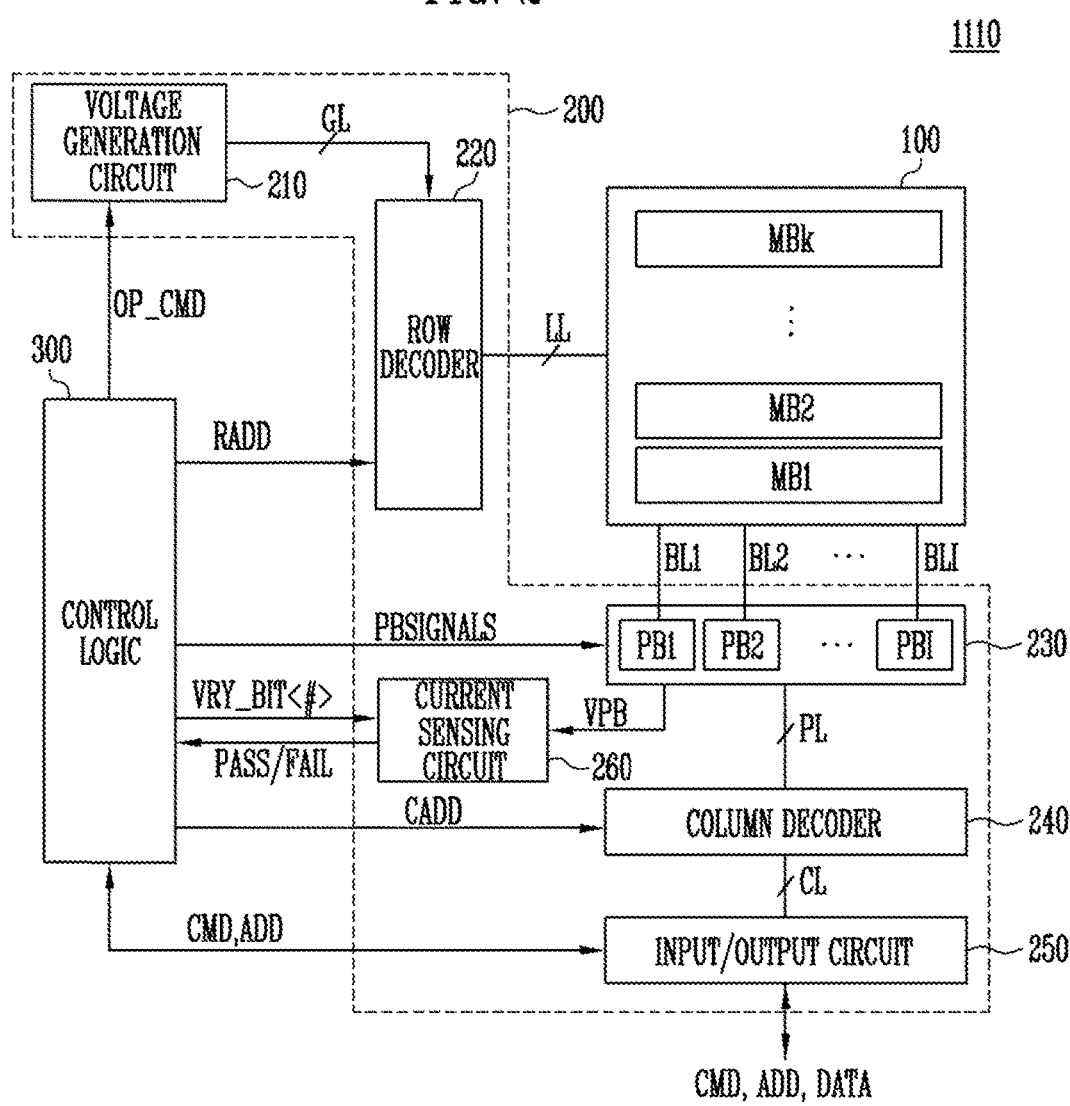
FIG. 2 is a diagram illustrating an example of a memory device of FIG. 1.

FIG. 2 is a diagram illustrating an example of a memory device of FIG. 1.

Referring to FIG. 2, the memory device 1110 may include a memory cell array 100 for storing data. The memory device 1110 may include peripheral circuits 200 configured to perform a program operation for storing data in the memory cell array 100, a read operation for outputting the stored data, and an erase operation for erasing the stored data. The memory device 1110 may include a control logic 300 for controlling the peripheral circuits 200 under the control of the memory controller (1120 of FIG. 1).

The memory cell array 100 may include a plurality of memory blocks MB1 to MBk (k is a positive integer). Each of the memory blocks MB1 to MBk may be implemented in a two-dimensional or three-dimensional structure. The memory blocks MB1 to MBk may be coupled to local lines LL and bit lines BL1 to BLI (I is a positive integer). For example, the bit lines BL1 to BLI may be coupled in common to the memory blocks MB1 to MBk, and the local lines LL may be coupled to the memory blocks MB1 to MBk, respectively.

The peripheral circuits 200 may be configured to program or erase memory cells included in a selected page under the control of the control logic 300. Here, a page refers to a group of memory cells, and a plurality of pates may constitute a memory block. More specifically, a plurality of word lines may be included in the local lines LL, and a group of memory cells coupled to one word line is referred to as a page. The program operation may include a threshold voltage increase operation and a verify operation. Here, the threshold voltage increase operation may increase threshold voltages of selected memory cells by applying a program voltage to a selected word line, and the verify operation may determine whether the threshold voltages of the selected memory cells have reached target voltages. For example, if the threshold voltage increase operation and the verify operation constitutes one program loop, a plurality of program loops may be performed until the threshold voltages of the selected memory cells reach a threshold voltage within a range representing a target data value. For example, the program loop may include applying program pulses (e.g., incremental step program pulses) to cause an incremental change in threshold voltage of the selected memory cell and, between each program pulse, applying one or more program verify voltages to determine whether the threshold voltage of the selected memory cell exceeds a program verify level. In order to reduce the time required to perform the program operation, however, some of the verify operations may be selectively skipped. A program loop that does not include a verify operation may be referred to as a blind program operation. For example, only the threshold voltage increase operation may be performed without any verify operation during a blind program period, and the threshold voltage increase operation and the verify operation may be performed during a normal program period.

The peripheral circuits 200 performs a program operation on selected pages under the control of the control logic 300. The peripheral circuits 200 may apply program voltages/verify voltages to selected word lines coupled to selected memory cells and apply pass voltages to unselected word lines. In an embodiment, the peripheral circuits 200 may adjust a pass voltage to be applied to the unselected word lines in the above-described blind program operation. To this end, the peripheral circuits 200 may include a voltage generation circuit 210, a row decoder 220, a page buffer group 230, a column decoder 240, an input/output circuit 250, and a current sensing circuit 260.

Each circuit may be described in detail as follows.

The voltage generation circuit 210 generates various operation voltages Vop used in a program, read, or erase operation in response to an operation signal OP_CMD. For example, the voltage generation circuit 210 may generate a program voltage, a read voltage, a pass voltage, a turn-on voltage, and the like. Particularly, the voltage generation circuit 210 may generate, as the pass voltage, a first pass voltage and a second pass voltage. The second pass voltage may be generated as a positive voltage lower than the first pass voltage, and may be gradually increased.

The row decoder 220 may transmit the operation voltages Vop to a word line WL coupled to a selected memory block in response to a row address RADD. Although not shown in FIG. 2, the row decoder 220 may transmit the operation voltages Vop to source select lines, drain select lines, a source line, or pipe lines in response to the row address RADD.

The page buffer group 230 may include a plurality of page buffers PB1 to PBI respectively coupled to the bit lines BL1 to BLI. The page buffers PB1 to PBI may operate in response to page buffer control signals PBSIGNALS. For example, the page buffers PB1 to PBI may temporarily store data input from an external device in the program operation, and may temporarily store data read from a selected page in the read operation.

The column decoder 240 may be provided for data exchange between the input/output circuit 250 and the page buffer group 230. For example, in response to a column address CADD, the column decoder 240 may transmit/receive data to/from the page buffers PB through data lines DL, or may transmit/receive data to/from the input/output circuit 250 through column lines CL.

The input/output circuit 250 may transmit, to the control logic 300, a command CMD and an address ADD, which are transmitted from the memory controller (1120 of FIG. 1), or may transmit/receive data DATA to/from the column decoder 240.

The current sensing circuit 260, in a read or verify operation, may generate a reference current in response to a permission bit VRY_BIT<#> and compare the reference current with a sensing voltage VPB received from the page buffer group 230, thereby outputting a pass signal PASS or a fail signal FAIL.

The control logic 300 may control the peripheral circuits 200 by outputting the operation signal OP_CMD, the row address RADD, the page buffer control signals PBSIGNALS, the column address CADD, and the permission bit VRY_BIT<#> in response to the command CMD and the address ADD. Also, the control logic 300 may determine whether a certain memory cell has passed or failed a program verification in response to the pass or fail signal PASS or FAIL. Particularly, in a blind program operation, the control logic 300 may control the peripheral circuits 200 to adjust pass voltages applied to unselected word lines. For example, in the blind program operation, the control logic 300 may control the peripheral circuits 200 to apply a program voltage to a selected word line, apply a first pass voltage to unselected word lines adjacent to the selected word line, and apply a second pass voltage lower than the first pass voltage to the other unselected word lines.

Figure 3:
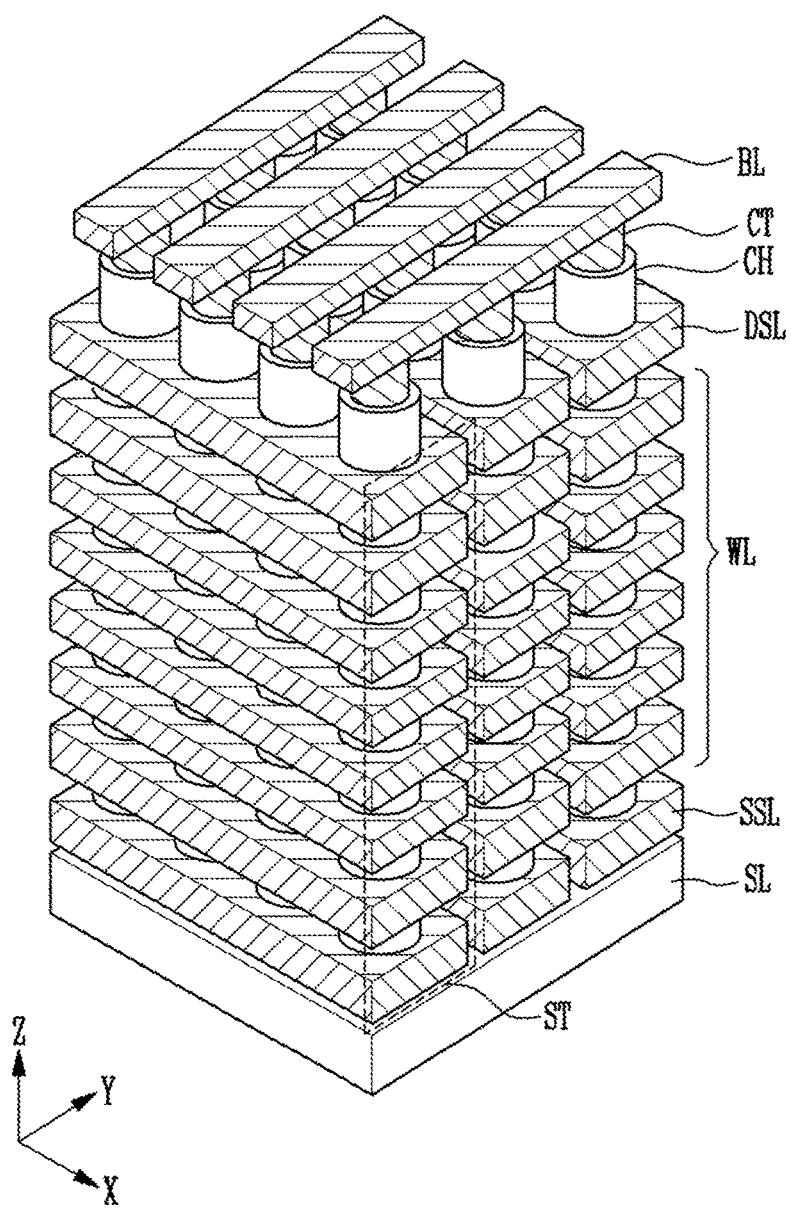
FIG. 3 is a perspective view illustrating an example of a memory block configured in a three-dimensional structure according to an embodiment of the present disclosure.

FIG. 3 is a perspective view illustrating an example of a memory block configured in a three-dimensional structure according to an embodiment of the present disclosure.

Referring to FIG. 3, the memory block in accordance with an embodiment may have a three-dimensional structure. For example, the memory block may be formed in a vertical direction (e.g., Z direction) on a substrate, and may include cell strings ST arranged between bit lines BL and a source line SL. For example, the cell strings ST may be formed in an I-shape. This structure may be also referred to as a bit cost scalable (BiCS) structure. For example, when the source line SL is horizontally formed over the substrate, the cell strings ST having the BiCS structure may be formed in the vertical direction over the source line SL. More specifically, the cell strings ST may be arranged in X and Y directions. The cell strings ST may include source select lines SSL, word lines WL, and drain select lines DSL, which are stacked over the source line SL to be spaced apart from each other. The number of source select lines SSL, word lines WL, and drain select lines DSL is not limited to the number shown in FIG. 3, and may be changed depending on memory devices. The cell strings ST may include vertical channel layers CH vertically penetrating the source select lines SSL, the word lines WL, and the drain select lines DSL. The bit lines BL may contact the tops of the vertical channel layers CH extending upward from the drain select lines DSL, extend in the Y direction, and be arranged in the X direction. Memory cells may be formed between the word lines WL and the vertical channel layers CH. Contact plugs CT may be further formed between the bit lines BL and the vertical channel layers CH.

Figure 4:
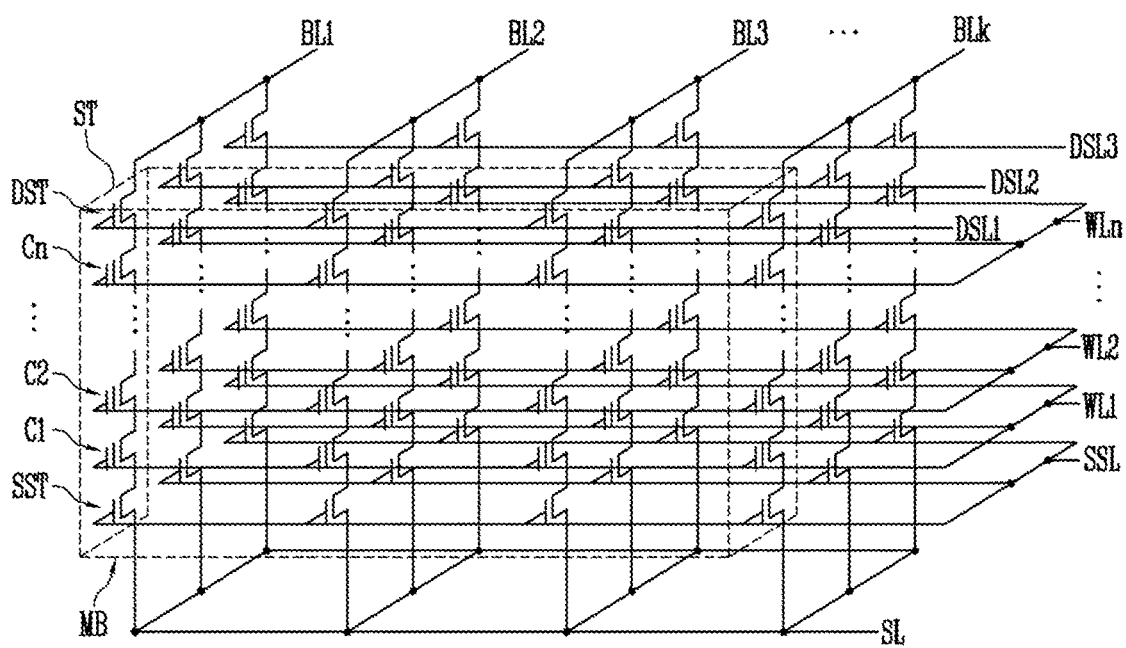
FIG. 4 is a circuit diagram illustrating an example of the memory block of FIG. 3 according to an embodiment of the present disclosure.

FIG. 4 is a circuit diagram illustrating an example of the memory block of FIG. 3 according to an embodiment of the present disclosure.

Referring to FIG. 4, the memory block formed in a three-dimensional structure may include a plurality of cell strings ST. The cell strings ST may include source select transistors SST, memory cells C1 to Cn (n is a positive integer), and drain select transistors DST, which are coupled between a source line SL and bit lines BL1 to BLk (k is a positive integer).

Gates of source select transistors SST included in different cell strings ST may be coupled to a source select line SSL. Gates of memory cells C1 to Cn included in the cell strings ST may be coupled to word lines WL1 to WLn. Gates of the drain select transistors DST included in the cell strings ST may be coupled to the select lines DSL1 to DSL3.

Among the cell strings ST, a group of cell strings ST that are coupled to different bit lines BL1 to BLk and coupled to the same drain select line (any one of DSL1 to DSL3) may constitute a memory block MB. For example, cell strings ST coupled to a first drain select line DSL1 may constitute one memory block MB, and cell strings ST coupled to a second drain select line DSL2 may constitute one memory block MB. The source select line SSL and the word lines WL1 to WLn may be coupled in common to memory blocks, and the drain select lines DSL1 to DSL3 may be coupled to the memory blocks, respectively.

In FIG. 4, it has been illustrated that one source select line SSL and one drain select line (any one of DSL1 to DSL3) are coupled to each cell string ST, but more than one source select line and more than one drain select line may be coupled to each cell string ST. In addition, the cell strings ST may further include dummy cells (not illustrated) coupled to a dummy line (not illustrated). For example, the dummy cells may be coupled between some of the memory cells C1 to Cn.

Figure 5:
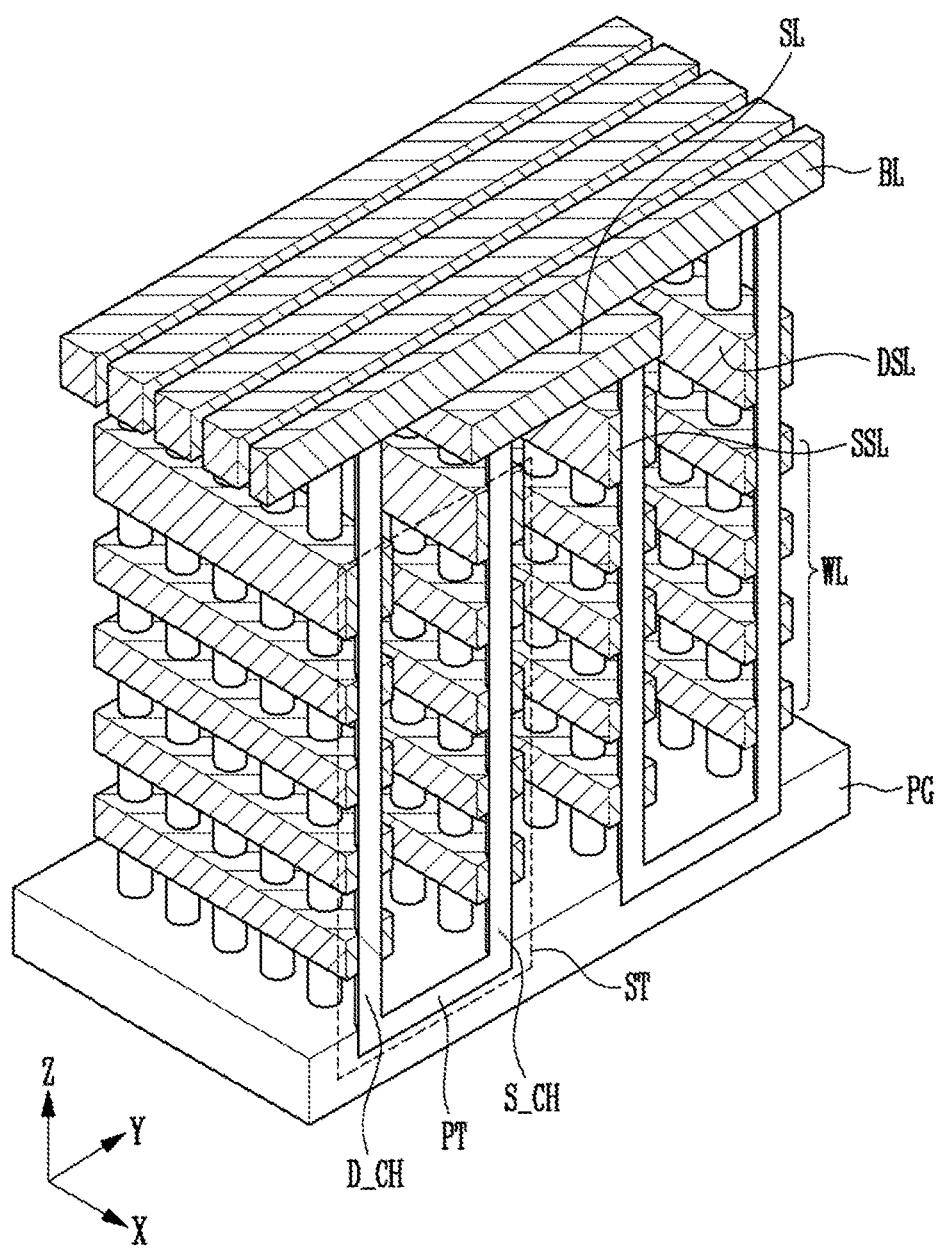
FIG. 5 is a perspective view illustrating an example of a memory block configured in a three-dimensional structure according to an embodiment of the present disclosure.

FIG. 5 is a perspective view illustrating an example of a memory block configured in a three-dimensional structure according to an embodiment of the present disclosure.

Referring to FIG. 5, the memory block in accordance with an embodiment may have a three-dimensional structure. For example, the memory block may include U-shape cell strings ST formed in a vertical direction on a substrate. The U-shape cell strings ST may be formed between bit lines BL and a pipe transistor PT and between a source line SL and the pipe transistor PT. Word lines WL and source select lines SSL may be stacked between the source line SL and the pipe transistor PT, and a source channel layer S_CH may be formed to vertically penetrate the word lines WL and the source select lines SSL. Word lines WL and drain select lines DSL may be stacked between the bit line BL and the pipe transistor PT, and a drain channel layer D_CH may be formed to vertically penetrate the word lines WL and the drain select lines DSL. Although not shown in FIG. 5, memory cells and select transistors may be formed in the source channel layer S_CH and the drain channel layer D_CH. A gate of the pipe transistor PT may be coupled to a pipe gate PG. This structure is also referred to as a pipe-shaped bit cost scalable (P-BiCS) structure.

Figure 6:
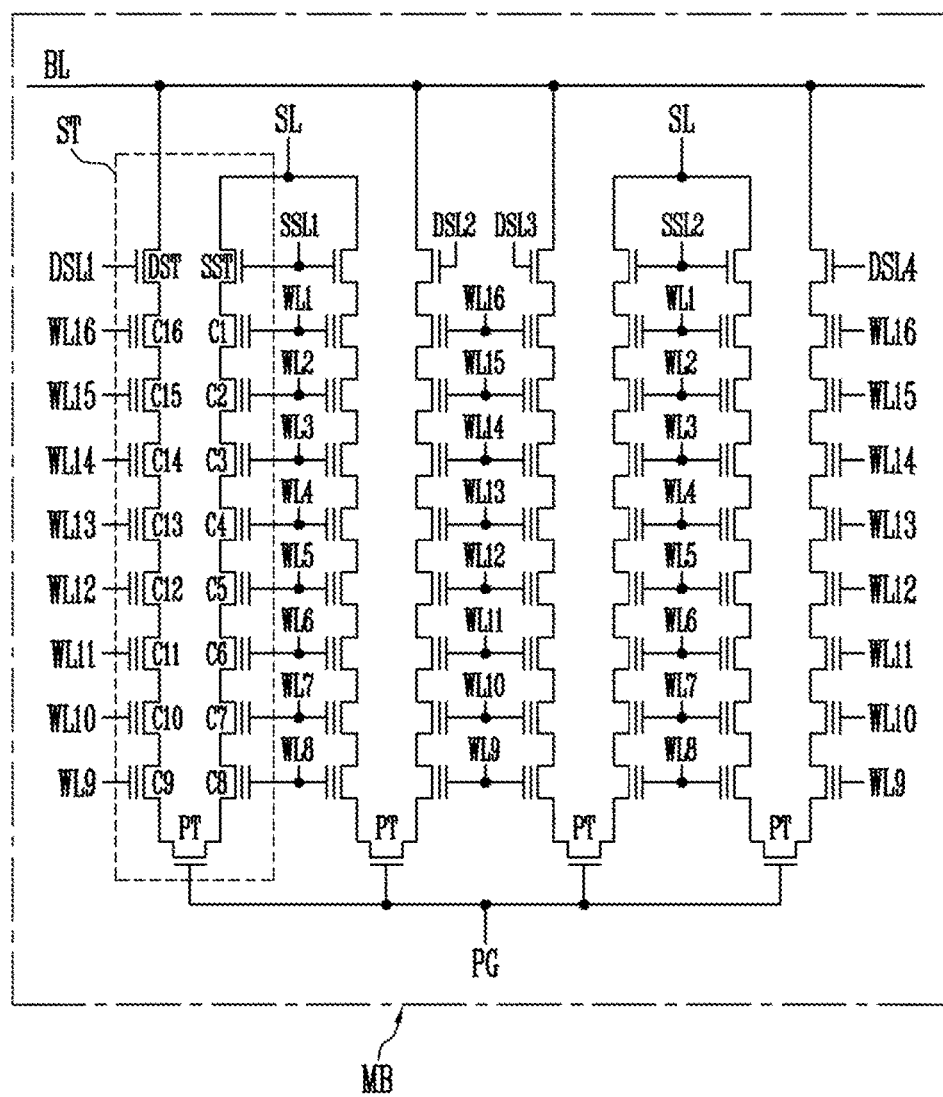
FIG. 6 is a circuit diagram illustrating an example of the memory block of FIG. 5 according to an embodiment of the present disclosure.

FIG. 6 is a circuit diagram illustrating an example of the memory block of FIG. 5 according to an embodiment of the present disclosure.

Referring to FIG. 6, the memory block MB may include a plurality of cell strings ST coupled to bit lines BL. Cell Strings ST coupled to any one bit line BL are illustrated in FIG. 6. The cell strings ST having a U-shaped structure may include source select transistors SST and memory cells C1 to C8, which are coupled between a source line SL and pipe transistors PT, and memory cells C9 to C16 and drain select transistors DST, which are coupled between the bit line BL and the pipe transistors PT. The source select transistors SST may be controlled by a voltage supplied to source select lines SSL1 and SSL2, and the memory cells C1 to C8 may be controlled by a voltage supplied to word lines WL1 to WL8. The drain select transistors DST may be controlled by a voltage supplied to drain select lines DSL1 to DSL4, and the memory cells C9 to C16 may be controlled by a voltage applied to word lines WL9 to WL16.

If a memory block MB is selected, a pipe transistor PT coupled between a pair of memory cells C8 and C9 located at a lower portion of the cell string ST having the U-shaped structure may electrically couple channels of the cell strings ST included in the selected memory block MB to each other.

In the memory block MB having the three-dimensional structure, a plurality of strings ST may be coupled in common to each bit line BL. In the same memory block MB, cell strings ST are coupled in common to one bit line BL, and the number of cell strings ST controlled by the same word lines WL1 to WL16 may be changed depending on design.

As a plurality of cell strings ST are coupled in parallel to one bit line BL, a particular cell string may be selected by selectively turning on drain select transistors DST in response to voltages applied to drain select lines DSL1 to DSL4.

The source select lines SSL1 and SSL2, the drain select lines DSL1 to DSL4, the word lines WL1 to WL16, and a pipe gate PG may be included in the local lines (LL of FIG. 2) coupled to the memory block MB. The pipe gate PG may be coupled in common to the pipe transistors PT in the same memory block MB.

In the memory block MB, memory cells that are coupled to different bit lines BL and coupled in common to one of the drain select lines DSL1 to DSL4 may constitute one page. A program operation may be performed on a page-by-page basis.

In FIG. 6, it has been illustrated that one source select line (any one of SSL1 and SSL2) and one drain select line (any one of DSL1 to DSL4) are coupled to each string ST, but more than one source select line and more than one drain select line may be coupled to each cell string ST. In addition, the cell strings ST may further include dummy cells (not illustrated) coupled to dummy lines (not illustrated). For example, the dummy cells may be coupled between some of the memory cells C1 to C16.

Figure 7:
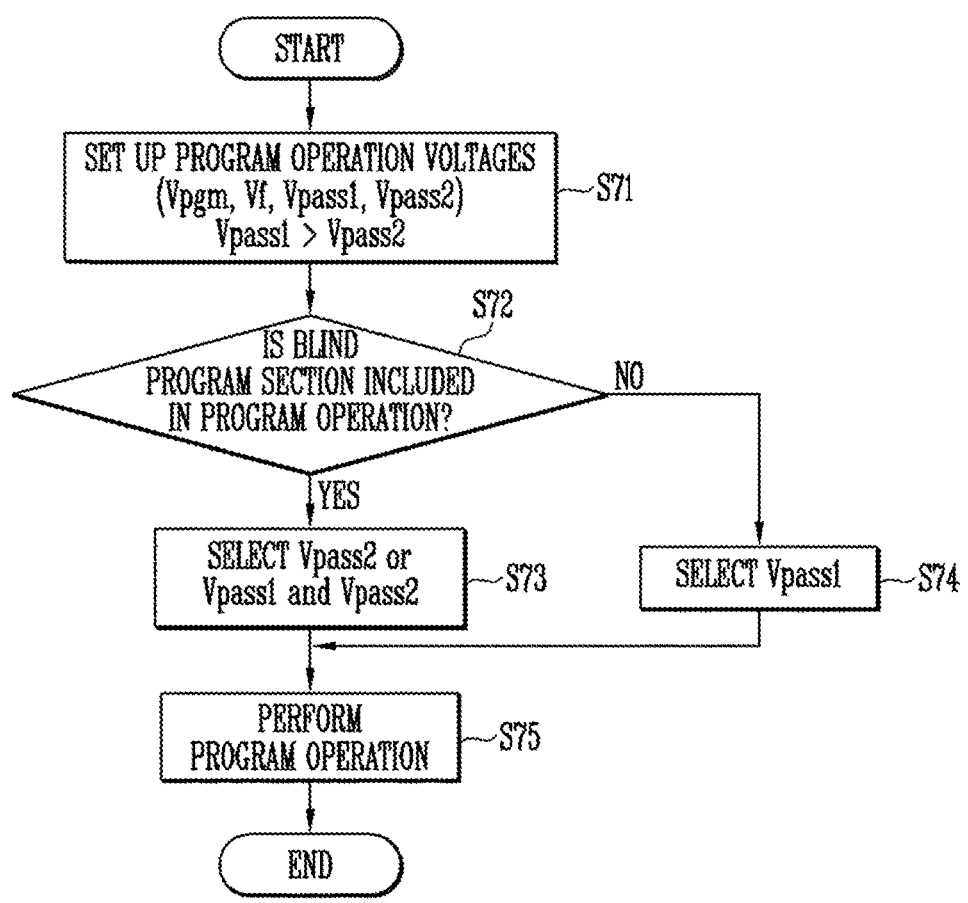
FIG. 7 is a flowchart illustrating an example of a program operation according to an embodiment of the present disclosure.

FIG. 7 is a flowchart illustrating an example of a program operation according to an embodiment of the present disclosure.

Referring to FIG. 7, if a program operation is started in response to a program command, program operation voltages to be used in the program operation are set up (S71). For example, a program voltage Vpgm, a verify voltage Vf, a first pass voltage Vpass1, a second pass voltage Vpass2, and the like may be used as the program operation voltages. The program voltage Vpgm is a voltage that is supplied to a selected word line so as to increase threshold voltages of selected memory cells. The verify voltage Vf is a voltage that is supplied to the selected word line so as to sense the threshold voltages of the selected memory cells. The first and second pass voltages Vpass1 and Vpass2 are voltages that are applied to unselected word lines in the program operation. Here, the first pass voltage Vpass1 is a pass voltage that is set as a default pass voltage, and the second pass voltage Vpass2 is a pass voltage that is lower than the first pass voltage Vpass1. One of the first and second pass voltages Vpass1 and Vpass2 may be selected depending on where the unselected word lines are located (e.g., whether the unselected word lines are adjacent to the selected word line or the unselected word lines are spaced apart from the selected word line). In addition, a step voltage of the program voltages Vpgm (i.e., the increase in magnitude of each program voltage Vpgm relative to the immediately previous program voltage Vpgm) may also be set up in step 'S71.'

If the program operation voltages are set up (S71), it is determined whether a blind program period is included in the program operation (S72). For example, in some cases, the program operation may include only a normal program period, but in other cases, the program operation may include both of the normal program period and the blind program period. In the normal program period, program voltages Vpgm are applied to increase the threshold voltages of the selected memory cells, and a verify operation may be performed between each program voltage Vpgm. In the blind program period, program voltages Vpgm are applied to increase the threshold voltages of the selected memory cells, but no verify operation is performed between each program voltage Vpgm. Based on a program command CMD of the memory device (1110 of FIG. 2), the control logic (300 of FIG. 2) may determine whether the blind program period is included in the program operation. For example, if a normal program command is input, the control logic 300 may determine that only the normal program period is included in the program operation and accordingly perform a setup operation. If a blind program command is input, the control logic 300 may determine that the blind program period and the normal program period are included in the program operation and accordingly perform the setup operation.

In step 'S72,' if it is determined that the program operation includes the blind program period (Yes), the second pass voltage Vpass2 or both the first and second pass voltages Vpass1 and Vpass2 may be selected as the pass voltage to be applied to the unselected word lines (S73). In step 'S72,' if it is determined that the program operation includes the normal program period only (No), the first pass voltage Vpass1 is selected as the pass voltage to be applied to the unselected word lines (S74).

Subsequently, the program operation is performed using the selected pass voltage (S75). When the program operation includes only the normal program period, the program operation may be performed using the program voltage Vpgm, the verify voltage Vf, and the first pass voltage Vpass1. When the program operation includes the blind program period, the program operation may be performed using the program voltage Vpgm, the verify voltage Vf, the first pass voltage Vpass1, and the second pass voltage Vpass2.

The program operation in which the blind program period is included may be described in more detail as follows.

In the blind program period, the program voltage Vpgm is applied to a selected word line. In addition, the first pass voltage Vpass1 is applied to unselected word lines adjacent to the selected word line, and the second pass voltage Vpass2 lower than the first pass voltage Vpass1 is applied to the other unselected word lines (i.e., word lines except the selected word line and the adjacent unselected word lines).

Since the program voltage Vpgm is not high in the blind program period, it is unnecessary to apply a high pass voltage (e.g., the first pass voltage) to all of the unselected word lines. A high-level pass voltage applied to the unselected word lines may cause stress on the memory cells coupled to the unselected word lines. Thus, in an embodiment, the first pass voltage is applied to only the adjacent unselected word lines (i.e., unselected word lines adjacent to the selected word line), and the second pass voltage lower than the first pass voltage is applied to the other unselected word lines, so that it is possible to reduce stress that may be exerted on the memory cells.

Voltages applied to the word lines in the blind program period will be described in more detail as follows.

FIGS. 8 to 13 are diagrams illustrating examples of blind program periods according to various embodiments.

Figure 8:
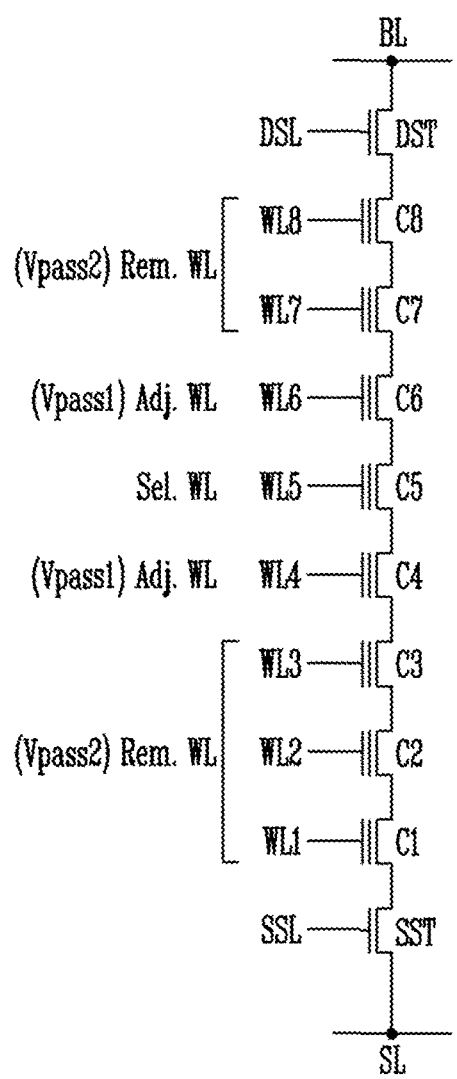
FIGS. 8 to 13 are diagrams illustrating examples of blind program periods according to various embodiments.

FIG. 8 illustrates an embodiment when a selected word line Sel. WL is located in the vicinity of the center of an I-shaped cell string in a program operation of the cell string. Although not illustrated, the cell string may further include dummy cells coupled to dummy lines. The dummy cells may be coupled between memory cells C1 to C8, or may be coupled between the memory cells C1 to C8 and drain and source select transistors DST and SST. In the following embodiment, a cell string in which the dummy cells are omitted will be described as an example.

Referring to FIG. 8, the cell string may include a source select transistor SST, memory cells C1 to C8, and a drain select transistor DST, which are coupled in series between a source line SL and a bit line BL. FIG. 8 illustrates an example of an operating method in accordance with an embodiment of the present disclosure, and therefore the number of source select transistors, memory cells, and drain select transistors is not limited to the number shown in FIG. 8. A gate of the source select transistor SST may be coupled to a source select line SSL, gates of the memory cells C1 to C8 may be coupled to word lines WL1 to WL8, and a gate of the drain select transistor DST may be connected to the drain select line DSL.

When the program voltage Vpgm is applied to a selected word line Sel. WL among the plurality of word lines WL1 to WL8, the first and second pass voltages Vpass1 and Vpass2 may be selectively applied to unselected word lines Rem. WL and Adj. WL. Alternatively, only the second pass voltage Vpass2 may be applied to all of the unselected word lines Rem. WL and Adj. WL. Here, the second pass voltage Vpass2 may be a voltage lower than the first pass voltage Vpass1. When the first and second pass voltages Vpass1 and Vpass2 are selectively applied to the unselected word lines Rem. WL and Adj. WL, the first pass voltage Vpass1 may be applied to adjacent unselected word lines Adj. WL, and the second pass voltage Vpass2 may be applied to the other unselected word lines Rem. WL. Here, the adjacent unselected word lines Adj. WL may be unselected word lines that are immediately adjacent to the selected word line Sel. WL, respectively. For example, when a fifth word line WL5 is the selected word line Sel. WL, fourth and sixth word lines WL4 and WL6 may be the adjacent unselected word lines Adj. WL, and first to third word lines WL1 to WL3 and seventh and eighth word lines WL7 and WL8 may be the other unselected word lines Rem. WL.

Although not illustrated, when dummy lines are coupled to the cell string, the first or second pass voltage Vpass1 or Vpass2 may be applied to the dummy lines. For example, if the dummy lines are word lines adjacent to the selected word line Sel. WL, the first pass voltage Vpass1 may be applied to the dummy lines. When the dummy lines are the other unselected dummy lines, the second pass voltage Vpass2 may be applied to the dummy lines.

Hereinafter, it is assumed that the unselected word lines are divided into adjacent unselected word lines Adj. WL and the other unselected word lines Rem. WL.

Figure 9:
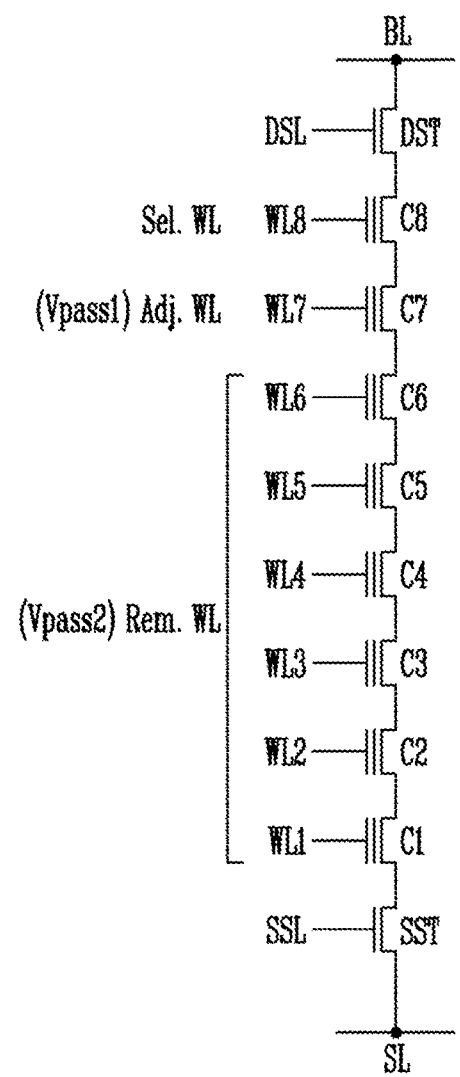

FIG. 9 illustrates an embodiment when a selected word line Sel. WL is located in the vicinity of an outer portion of an I-shaped cell string in a program operation of the cell string.

Referring to FIG. 9, when the selected word line Sel. WL is an eighth word line WL8 that is an outermost word line, only a seventh word line WL7 may be an adjacent unselected word line Adj. WL, and first to sixth word lines WL1 to WL6 may be the other unselected word lines Rem. WL. In this case, when the program voltage Vpgm is applied to the selected word line Sel. WL, the first pass voltage Vpass1 may be applied to the adjacent unselected word line Adj. WL, and the second pass voltage Vpass2 may be applied to the other unselected word lines Rem. WL.

Figure 10:
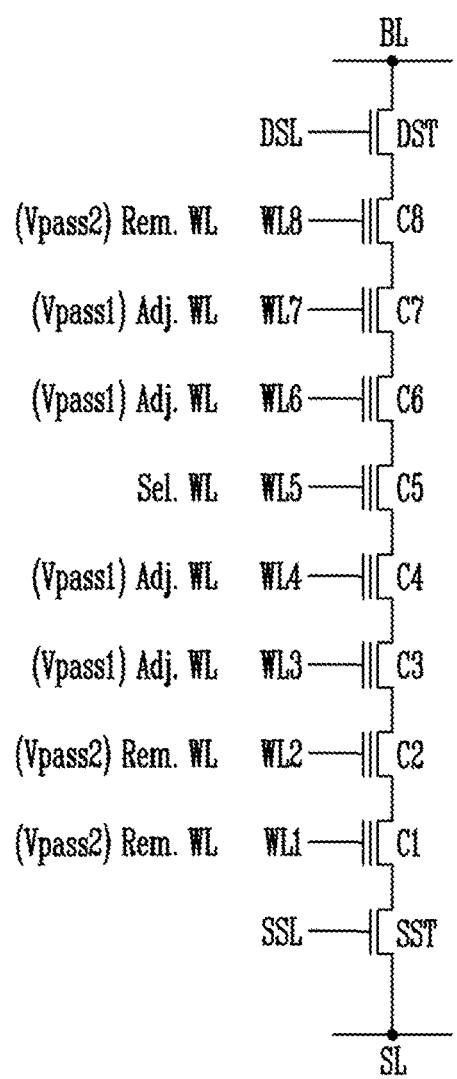

FIG. 10 illustrates an example where a selected word line Sel. WL is located in the vicinity of the center of an I-shaped cell string, and, on either side of the selected word line Sel. WL, more than one unselected word lines Adj. WL are determined to be "adjacent."

Referring to FIG. 10, when the program voltage Vpgm is applied to the selected word line Sel. WL, the first pass voltage Vpass1 may be applied to adjacent unselected word lines Adj. WL (i.e., unselected word lines adjacent to the selected word line Sel. WL). The number of adjacent unselected word lines Adj. WL may be differently set depending on memory devices. Here, on either side of the selected word line Sel. WL, more than one unselected word lines may be the "adjacent" word lines Adj. WL. For example, if a fifth word line WL5 is the selected word line Sel. WL, then third, fourth, sixth, and seventh word lines WL3, WL4, WL6, and WL7 may be the adjacent unselected word lines Adj. WL. Here, first, second, and eighth word lines WL1, WL2, and WL8 may be the other unselected word lines Rem. WL, and the second pass voltage Vpass1 lower than the first pass voltage Vpass1 may be applied to the other unselected word lines Rem. WL.

Figure 11:
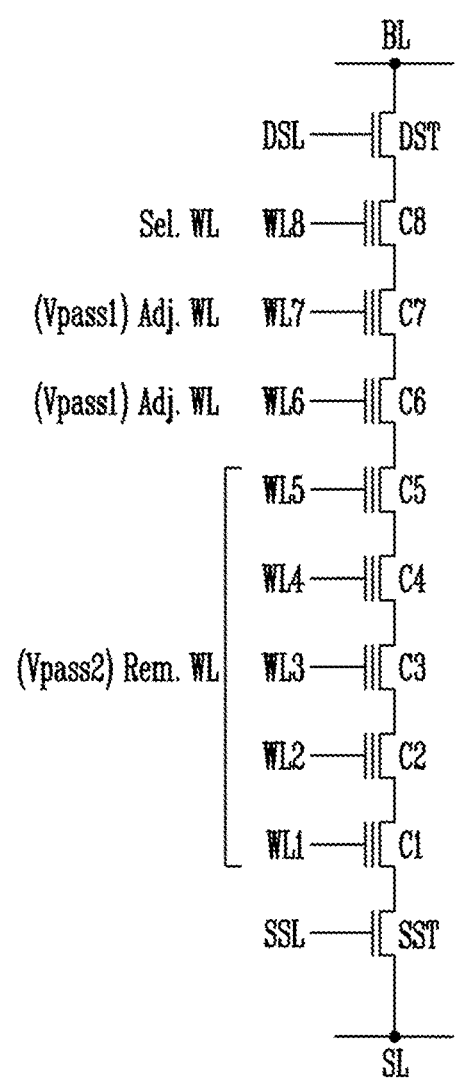

FIG. 11 illustrates an example where a selected word line Sel. WL is located at an outer portion of an I-shaped cell string and more than one unselected word lines Adj. WL are determined to be "adjacent."

Referring to FIG. 11, when the selected word line Sel. WL is an eighth word line WL8, which is an outermost word line, sixth and seventh word lines WL6 and WL7 may be adjacent unselected word lines Adj. WL, and first to fifth word lines WL1 to WL5 may be the other unselected word lines Rem. WL. In this case, when the program voltage Vpgm is applied to the selected word line Sel. WL, the first pass voltage Vpass1 may be applied to the adjacent unselected word lines Adj. WL, and the second pass voltage Vpass1 may be applied to the other unselected word lines Rem. WL.

Figure 12:
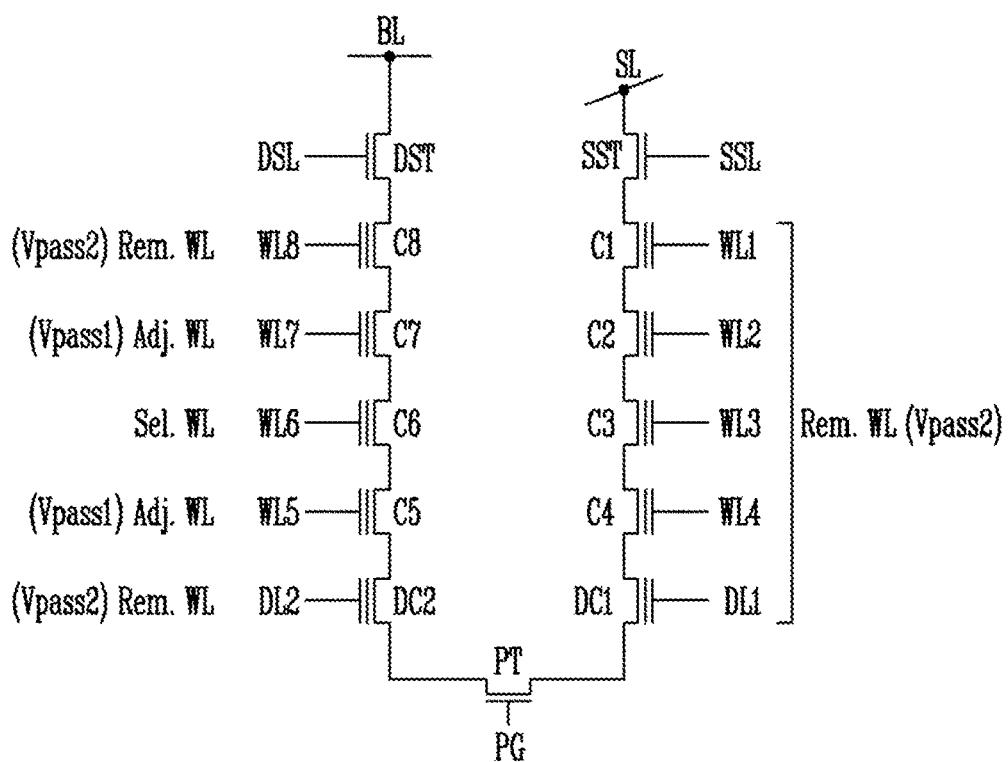

FIG. 12 illustrates an example where a selected word line Sel. WL is located in the vicinity of the center of a U-shaped cell string including dummy lines DL1 and DL2.

Referring to FIG. 12, dummy cells DC1 and DC2 may be coupled between a pipe transistor PT and memory cells. The dummy cells DC1 and DC2 may be located at positions different from those shown in this figure. A gate of a first dummy cell DC1 may be coupled to a first dummy line DL1, and a gate of the second dummy cell DC2 may be coupled to a second dummy line DL2. The numbers and positions of the dummy cells DC1 and DC2 and the dummy lines DL1 and DL2 may vary depending on memory devices.

When the program voltage Vpgm is applied to the selected word line Sel. WL, the first pass voltage Vpass1 may be applied to adjacent unselected word lines Adj. WL (i.e., unselected word lines adjacent to the selected word line Sel. WL). The adjacent unselected word lines Adj. WL may be unselected word lines or dummy lines that are immediately adjacent to the selected word line Sel. WL. For example, when a sixth word line WL6 is the selected word line Sel. WL, fifth and seventh word lines WL5 and WL7 may be the adjacent unselected word lines Adj. WL. First to fourth word lines WL1 to WL4 and an eighth word line WL8, and the first and second dummy lines DL1 and DL2 may be the other unselected word lines Rem. WL, and the second pass voltage Vpass2 lower than the first pass voltage Vpass1 may be applied to the other unselected word lines Rem. WL. In the program operation of the U-shaped cell string, the number of adjacent unselected word lines Adj. WL may be differently set depending on memory devices.

Figure 13:
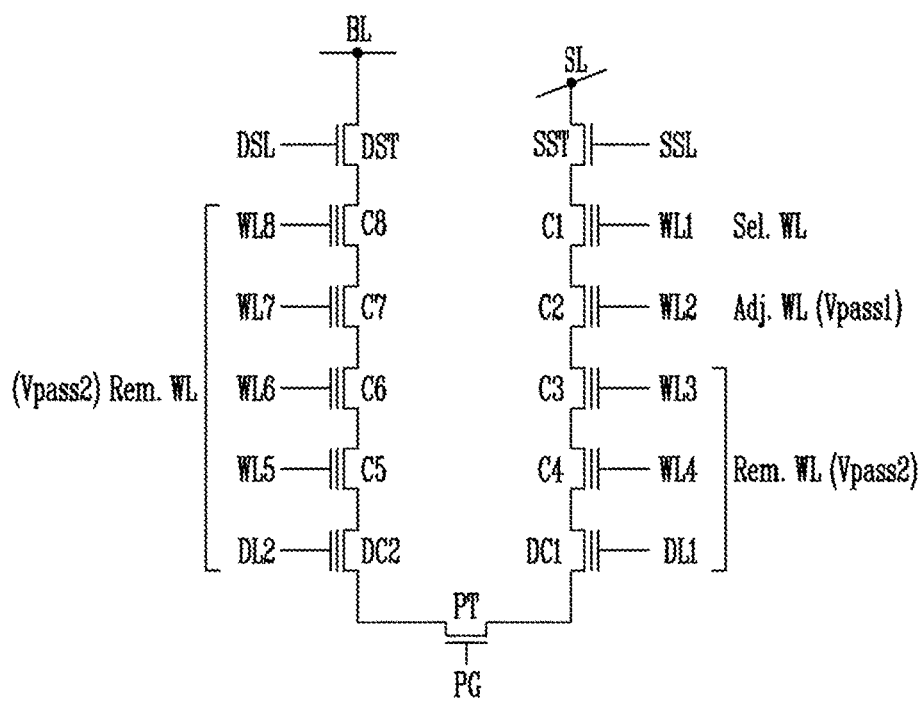

FIG. 13 illustrates an example where a selected word line Sel. WL is located at an outer portion of a U-shaped cell string including dummy lines DL1 and DL2.

Referring to FIG. 13, when the selected word line Sel. WL is a first word line WL1, which is an outermost word line, a second word line WL2 may be an adjacent unselected word line Adj. WL, and third to eighth word lines WL3 to WL8 and first and second dummy lines DL1 and DL2 may be the other unselected word lines Rem. WL. In this case, when the program voltage Vpgm is applied to the selected word line Sel. WL, the first pass voltage Vpass1 may be applied to the adjacent unselected word line Adj. WL, and the second pass voltage Vpass2 may be applied to the other unselected word lines Rem. WL.

The above-described program operation may be performed in a memory device that stores more than one bit of information per memory cell. A threshold voltage distribution of memory cells in the program operation may be described as follows.

Figure 14:
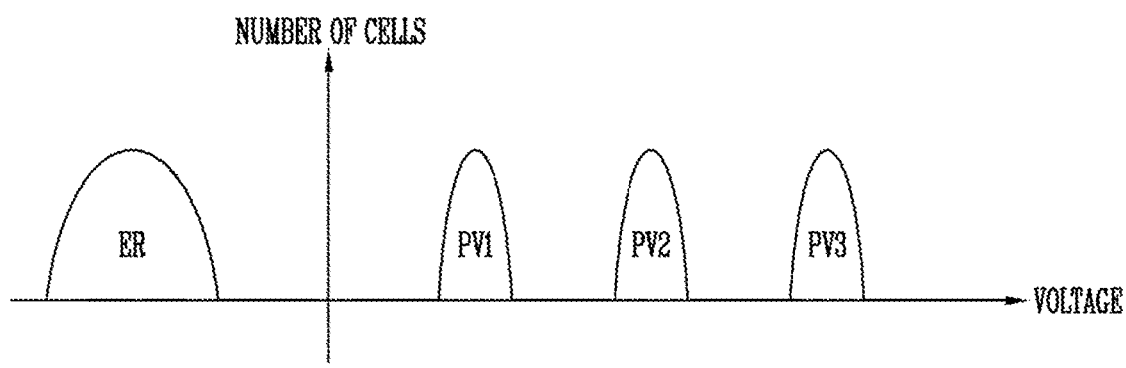
FIGS. 14 and 15 are diagrams illustrating examples of threshold voltage distributions according to program states of memory cells.
Figure 15:
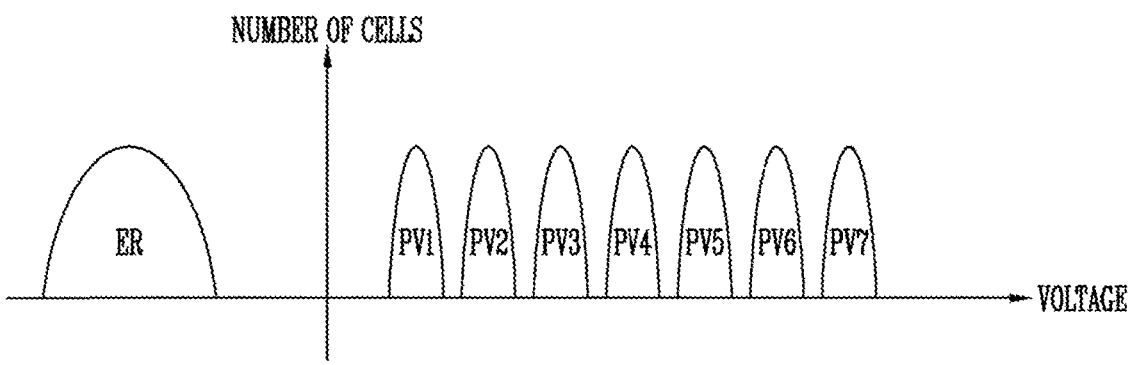

FIGS. 14 and 15 are diagrams illustrating examples of threshold voltage distributions according to program states of memory cells.

Referring to FIG. 14, in the case of a multi level cell (MLC) capable of storing two bits, threshold voltages of memory cells may be divided into an erase state ER and three program states PV1 to PV3.

Referring to FIG. 15, in the case of a triple level cell (TLC) capable of storing three bits, threshold voltages of memory cells may be divided into an erase state ER and seven program states PV1 to PV7.

In addition, a quadruple level cell (QLC) is capable of storing four bits, and it is also possible to store five or more bits per memory cell. As the number of bits stored in the memory cell increases, the number of threshold voltage distributions also increases.

When a memory cell is being programmed to a high threshold voltage distribution, verify operations may be skipped when relatively low program voltages are being applied. In other words, a blind program operation may be performed while relatively low program voltages are being applied. The blind program operation may be described as follows.

Figure 16:
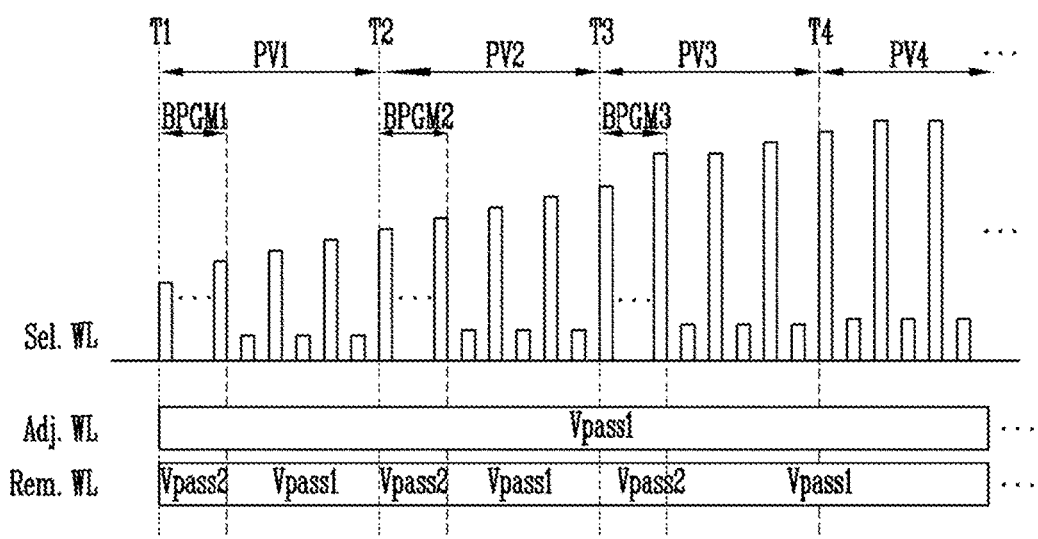
FIG. 16 is a diagram illustrating an example of a blind program operation according to an embodiment of the present disclosure.

FIG. 16 is a diagram illustrating an example of a blind program operation according to an embodiment of the present disclosure.

Referring to FIG. 16, a program operation of the memory device that stores four bits per memory cell is illustrated as an embodiment. The program operation may be performed using an incremental step pulse program (ISPP) scheme in which a program voltage is gradually increased. The program operation may include a threshold voltage increase operation and a verify operation. Here, the threshold voltage increase operation may increase threshold voltages of selected memory cells by applying a program voltage to a selected word line, and the verify operation may determine whether the threshold voltages of the selected memory cells have reached target voltages within a range representing target data values. In an embodiment, a blind program may be performed during the program operation. The blind program may be performed during a period of time when the threshold voltages of the selected memory cells are not expected to be able to reach the target voltages. Therefore, only the threshold voltage increase operation of the memory cells may be performed during the blind program period. The threshold voltage increase operation and the verify operation, which constitute one loop, may be performed during a normal program period.

More specifically, in FIG. 16, during a time period T1 to T2, the selected memory cells are programmed to a first program state PV1. During a time period T2 to T3, the selected memory cells are programmed to a second program state PV2 higher than the first program state PV1. During a time period T3 to T4, the selected memory cells are programmed to a third program state PV3 higher than the second program state PV2. During a time period T4 and after this time period, the selected memory cells are programmed to a fourth program state PV4, which is higher than the third program state PV3, or a program state higher than the fourth program state PV4.

When the selected memory cells are programmed, the program voltage Vpgm is applied to a selected word line Sel. WL, and the pass voltage is applied to unselected word lines (e.g., all word lines coupled to the same cell string except the selected word line Sel. WL). In an embodiment, the unselected word lines may be divided into adjacent unselected word lines Adj. WL (i.e., unselected word lines adjacent to the selected word line Sel. WL) and the other unselected word lines Rem. WL. The adjacent unselected word lines Adj. WL may be set as word lines that are immediately adjacent the selected word line Sel. WL.

In the time period T1 to T2, a time period when the program voltage Vpgm is consecutively applied to the selected word line Sel. WL without any verify operation is defined as a first blind program period BPGM1. The program voltage Vpgm may be gradually increased during the first blind program period BPGM1. This example is provided for illustration purposes, and therefore the duration of each time period may vary depending on memory devices. In the first blind program period BPGM1, during the application of the program voltage to the selected word line Sel. WL, the second pass voltage Vpass2 may be applied to all of the unselected word lines. Alternatively, in the first blind program period BPGM1, during the application of the program voltage to the selected word line Sel. WL, the first pass voltage Vpass1 may be applied to the adjacent unselected word lines Adj. WL (i.e., unselected word lines adjacent to the selected word line Sel. WL), and the second pass voltage Vpass1 lower than the first pass voltage Vpass1 may be applied to the other unselected word lines Rem. WL.

After the first blind program period BPGM1 is ended, the normal program including the threshold voltage increase operation and the verify operation may be performed. For example, during the threshold voltage increase operation (e.g., applying the program voltage Vpgm to the selected word line Sel. WL), the first pass voltage Vpass1 may be applied in common to the adjacent unselected word lines Adj. WL and the other unselected word lines Rem. WL. Even when the verify voltage Vf is applied to the selected word line Sel. WL, the first pass voltage Vpass1 may be applied in common to the adjacent unselected word lines Adj. WL and the other unselected word lines Rem. WL.

If the selected memory cells are all programmed to the first program state PV1, during the time period T2 to T3, other selected memory cells may be programmed to the second program state PV2.

The blind program may also be performed during the time period T2 to T3. For example, a time period when the program voltage Vpgm is consecutively applied to the selected word line Sel. WL without any verify operation is defined as a second blind program period BPGM2. The number of the program voltage pulse Vpgm applied during the second blind program period BPGM2 may vary depending on memory devices. During the application of the program voltage Vpgm to the selected word line Sel. WL in the second blind program period BPGM2, the second pass voltage Vpass2 may be applied to all of the unselected word lines, or the first pass voltage Vpass1 may be applied to the adjacent unselected word lines Adj. WL (i.e., unselected word lines adjacent to the selected word line Sel. WL), and the second pass voltage Vpass2 may be applied to the other unselected word lines Rem. WL. After the second blind program period BPGM2 is ended, the first pass voltage Vpass1 may be applied in common to the adjacent unselected word lines Adj. WL and the other unselected word lines Rem. WL during the application of the program voltage Vpgm to the selected word line Sel. WL in the normal program period.

If the selected memory cells are all programmed to the second program state PV2, during the time period T3 to T4, other selected memory cells may be programmed to the third program state PV3.

The blind program period may be performed even in the time period T3 to T4. For example, a time period when the program voltage Vpgm is consecutively applied to the selected word line Sel. WL without any verify operation is defined as a third blind program period BPGM3. During the application of the program voltage Vpgm to the selected word line Sel. WL in the third blind program period BPGM3, the second pass voltage Vpass2 may be applied to all of the unselected word lines. Alternatively, the first pass voltage Vpass1 may be applied to adjacent unselected word lines Adj. WL (unselected word lines adjacent to the selected word line Sel. WL), and the second pass voltage Vpass2 may be applied to the other unselected word lines Rem. WL. After the third blind program period BPGM3 is ended, during the application of the program voltage Vpgm to the selected word line Sel. WL in the normal program period, the first pass voltage Vpass1 may be applied in common to the adjacent unselected word lines Adj. WL and the other unselected word lines Rem. WL. Even when the verify voltage Vf is applied to the selected word line Sel. WL, the first pass voltage Vpass1 may be applied in common to the adjacent unselected word lines Adj. WL and the other unselected word lines Rem. WL.

If the selected memory cells are all programmed to the third program state PV3, during a time period T4, other selected memory cells may be programmed to the fourth program state PV4. When programming the memory cells to the fourth program state PV4, the normal program is performed. However, when the blind program is performed and when the normal program is performed may vary depending on memory devices. When the program operation does not include the blind program period, during the application of the program voltage Vpgm to the selected word line Sel. WL, the first pass voltage Vpass1 may be applied in common to adjacent unselected word lines Adj. WL (unselected word lines adjacent to the selected word line Sel. WL) and the other unselected word lines Rem. WL. Even when the verify voltage Vf is applied to the selected word line Sel. WL, the first pass voltage Vpass1 may be applied in common to the adjacent unselected word lines Adj. WL and the other unselected word lines Rem. WL.

In the above-described embodiments, it has been illustrated that, in the blind program period, which does not include the verify operation, the first pass voltage Vpass1 is applied to adjacent unselected word lines Adj. WL (unselected word lines adjacent to the selected word line Sel. WL), and the second pass voltage Vpass2 is applied to the other unselected word lines Rem. WL. This means that the pass voltage applied during the blind program period to the other unselected word lines Rem. WL located distant from the selected word line Sel. WL may be set to be lower than the pass voltage applied during the normal program period. In an example, the pass voltage applied to the other unselected word lines Rem. WL may be set in a way that the pass voltage gradually increases from a low level.

Figure 17:
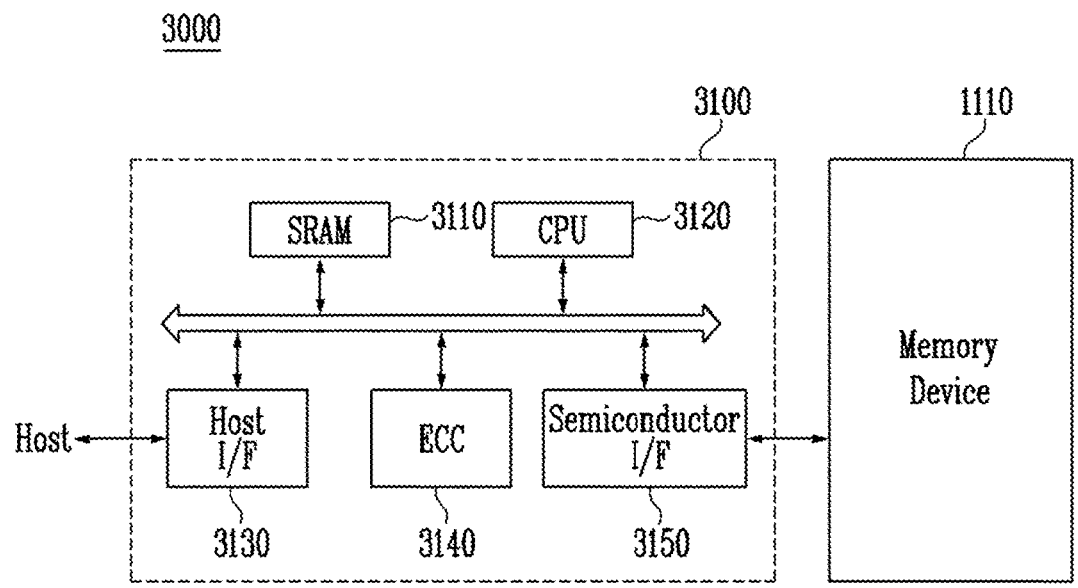
FIG. 17 is a diagram illustrating an example of a memory system including a memory device according to an embodiment of the present disclosure.

FIG. 17 is a diagram illustrating an example of a memory system including a memory device according to an embodiment of the present disclosure. Here, a memory device 1110 may be configured substantially identical to that of FIG. 2, and therefore detailed description of the memory device 1110 will be omitted.

Referring to FIG. 17, the memory system 3000 may include a controller 3100 and the memory device 1110. The controller 3100 may control the memory device 1110. An SRAM 3110 may be used as a working memory of a CPU 3120. A host interface (host I/F) 3130 may be provided with a data exchange protocol of a host coupled to the memory system 3000. An error correction circuit (ECC) 3140 provided in the controller 3100 may detect and correct errors included in data read out from the memory device 1110. A semiconductor interface (semiconductor I/F) 3150 may interface with the memory device 1110. The CPU 3120 may perform a control operation for data exchange of the controller 3100. Although not shown in FIG. 17, the memory system 3000 may further include a ROM (not illustrated) for storing code data for interfacing with the host.

The memory system 3000 may be applied to a computer, a ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital video recorder, a digital video player, a device capable of transmitting/receiving information in a wireless environment, and one of various electronic devices that constitute a home network.

Figure 18:
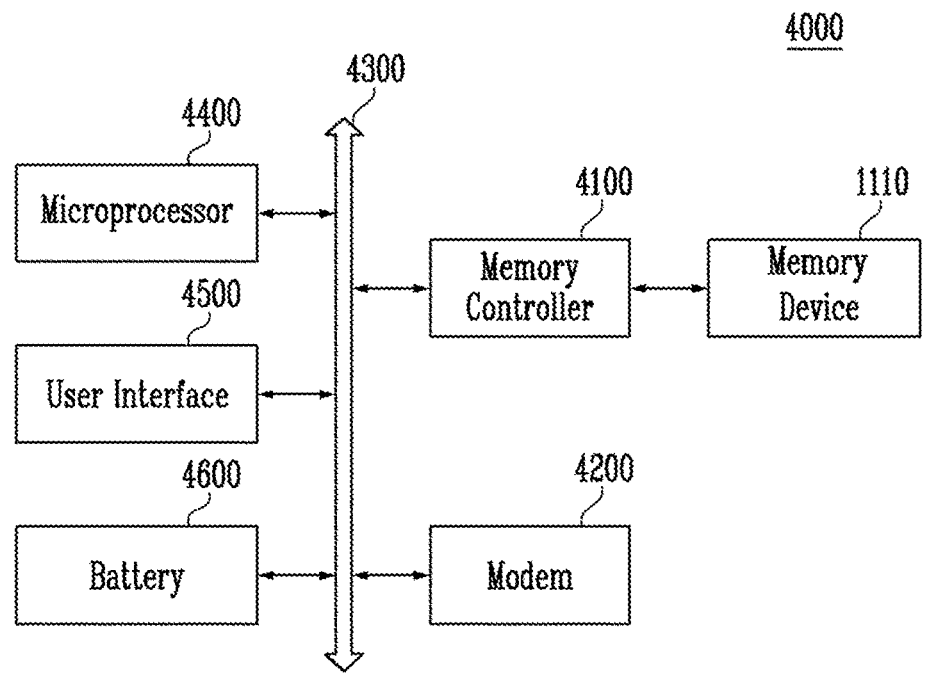
FIG. 18 is a diagram illustrating a schematic configuration of a computing system including a memory device according to an embodiment of the present disclosure.

FIG. 18 is a diagram illustrating a schematic configuration of a computing system including a memory device according to an embodiment of the present disclosure. Here, a memory device 1110 may be configured substantially identical to that of FIG. 2, and therefore detailed description of the memory device 1110 will be omitted.

Referring to FIG. 18, the computing system 4000 includes the memory device 1110, a controller 4100, a modem 4200, a microprocessor 4400, and a user interface 4500, which are electrically coupled to a bus 4300. When the computing system 4000 is a mobile device, a battery 4600 for supplying operation voltages of the computing system 4000 may be additionally provided in the computing system 4000. Although not illustrated, the computing system 4000 may further include an application chip set, a camera image processor (CIS), a mobile DRAM, and the like.

The controller 4100 and the memory device 1110 may constitute an SSD.

The system according to the present disclosure may be packaged in various forms. For example, the system according to the present disclosure may be packaged in various package types, such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

According to an embodiment of the present disclosure, it is possible to improve the reliability of a program operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
a memory block including a plurality of memory cells;
peripheral circuits configured to perform a program operation on the memory cells; and
a control logic configured to control the peripheral circuits to:
apply a program voltage to a selected word line,
apply a first pass voltage set as a default voltage to unselected word lines adjacent to the selected word line when the program voltage is applied to the selected word line, and
apply a second pass voltage lower than the first pass voltage to all unselected word lines except the unselected word line to which the first pass voltage is applied while the program voltage is applied to the selected word line during a blind program period which does not include a verify operation.

2. The memory device of claim 1, wherein the peripheral circuits include a voltage generation circuit configured to generate the program voltage, a verify voltage, the first pass voltage, and the second pass voltage being a positive voltage lower than the first pass voltage, which are used in the program operation.

3. The memory device of claim 2, wherein the voltage generation circuit generates the second pass voltage to be gradually increased.

4. The memory device of claim 1, wherein, during a normal program period, threshold voltages of the memory cells increase by applying the program voltage to the selected word line and the verify operation is performed by applying a verify voltage to the selected word line and by applying the first pass voltage to the unselected word lines adjacent to the selected word line and the all unselected word lines.

5. The memory device of claim 1, wherein the memory block is formed in a three-dimensional structure in which the memory cells are stacked in a vertical direction.

6. The memory device of claim 5, wherein the selected word line is a word line coupled to selected memory cells among the memory cells, and the adjacent word lines are word lines that are immediately adjacent the selected word line.

7. The memory device of claim 1, wherein, during the blind program period, a plurality of program voltage pulses is consecutively applied to the selected word line.

8. A method of operating a memory device, the method comprising, during a blind program period which does not include a verify operation,
applying a program voltage to a selected word line,
applying a first pass voltage set as a default voltage to a first unselected word line and a second unselected word line adjacent to the selected word line when the program voltage is applied to the selected word line, and
applying a second pass voltage lower than the first pass voltage to third unselected word lines arranged between the first unselected word line and a bit line, and to fourth unselected word lines arranged between the second unselected word line and a source line while the program voltage is applied to the selected word line.

9. The method of claim 8, wherein the second pass voltage is a positive voltage lower than the first pass voltage.

10. The method of claim 8, wherein, during the blind program period, the program voltage being applied to the selected word line gradually increases.

11. The method of claim 8, wherein the time required to perform the blind program period is adjusted depending on memory devices.

12. The method of claim 8, wherein, during the blind program period, a plurality of program voltage pulses are consecutively applied to the selected word line.

13. A method of operating a memory device, the method comprising:
determining whether a program operation set to be performed includes a blind program period in which a program voltage is applied to a selected word line without performing a verify operation, in response to a program command; and
when the program operation includes the blind program period, programming selected memory cells by applying the program voltage to the selected word line, applying a first pass voltage set as a default voltage to unselected word lines adjacent to the selected word line when the program voltage is applied to the selected word line, and applying a second pass voltage lower than the first pass voltage to all unselected word lines except the unselected word lines to which the first voltage is applied while the program voltage is applied to the selected word line.

14. The method of claim 13, wherein, in determining whether the program operation includes the blind program period:

it is determined that, if the program command is a blind program command, the program operation includes the blind program period; and it is determined that, if the program command is a normal program command, the program operation does not include the blind program period.

15. The method of claim 14, wherein, if the program command is the blind program command, the program operation includes the blind program period and a normal program period.

16. The method of claim 15, wherein, during the normal program period, threshold voltages of the selected memory cells are increased by applying the program voltage to the selected word line, and a verify operation is performed to determine whether the threshold voltages of the selected memory cells have been reached target voltages.

17. The method of claim 14, wherein, if the program command is the normal program command, threshold voltages of the selected memory cells are increased by applying the program voltage to the selected word line, and a verify operation is performed to determine whether the threshold voltages of the selected memory cells have been reached target voltages.

18. The method of claim 13, further comprising, before determining whether the program operation includes the blind program period, setting up various voltages to be used in the program operation in response to the program command.

19. The method of claim 18, wherein the various voltages include the program voltage, the first pass voltage, the second pass voltage, and a verify voltage.

* * * * *